United States Patent
Nakada et al.

(10) Patent No.: US 10,928,865 B1
(45) Date of Patent: Feb. 23, 2021

(54) ELECTRONIC APPARATUS

(71) Applicant: LENOVO (SINGAPORE) PTE. LTD., Singapore (SG)

(72) Inventors: Kazuo Nakada, Yokohama (JP); Shinya Sekimoto, Yokohama (JP); Brian Hargrove Leonard, Morrisville, NC (US)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 16/683,262

(22) Filed: Nov. 14, 2019

(51) Int. Cl.
*G06F 1/16* (2006.01)
*H05K 5/00* (2006.01)
*H05K 5/02* (2006.01)

(52) U.S. Cl.
CPC .......... *G06F 1/1681* (2013.01); *G06F 1/1637* (2013.01); *H05K 5/0086* (2013.01); *H05K 5/0226* (2013.01)

(58) Field of Classification Search
CPC ... G06F 1/1637; G06F 1/1681; H05K 5/0086; H05K 5/0226
See application file for complete search history.

(56) References Cited

U.S. PATENT DOCUMENTS

| | | | | |
|---|---|---|---|---|
| 6,078,496 A * | 6/2000 | Oguchi | ................ | G06F 1/1616 16/223 |
| 6,154,359 A * | 11/2000 | Kamikakai | ........... | G06F 1/1618 16/342 |
| 6,191,941 B1 * | 2/2001 | Ito | ........................ | G06F 1/1616 361/679.27 |
| 6,307,740 B1 * | 10/2001 | Foster | .................. | G06F 1/1616 361/679.1 |
| 6,426,871 B2 * | 7/2002 | Foster | .................. | G06F 1/1616 361/679.1 |
| 6,456,488 B1 * | 9/2002 | Foster | .................. | G06F 1/1616 361/679.1 |
| 6,768,637 B1 * | 7/2004 | Amemiya | ............ | G06F 1/1632 361/679.27 |
| 7,444,176 B2 * | 10/2008 | Oda | .................... | H04M 1/0216 206/320 |
| 7,502,222 B2 * | 3/2009 | Cheng | .................. | G06F 1/1613 361/679.06 |
| 8,208,249 B2 * | 6/2012 | Chin | .................... | G06F 1/1677 361/679.27 |
| 8,295,039 B2 * | 10/2012 | Cheng | .................... | G06F 1/166 361/679.26 |

(Continued)

FOREIGN PATENT DOCUMENTS

JP    2016134051 A    7/2016

*Primary Examiner* — Abhishek M Rathod
*Assistant Examiner* — Keith DePew
(74) *Attorney, Agent, or Firm* — Shimokaji IP

(57) ABSTRACT

An electronic apparatus includes a first chassis, a second chassis and a third chassis which is configured to have a first coupling section which is rotatably coupled with a rear edge of the first chassis and a second coupling section which is rotatably coupled with a rear edge of the second chassis and thereby to couple together the first chassis and the second chassis to be rotationally movable relatively. The third chassis is installed to project more rearward than the rear edges of the first chassis and the second chassis by having the first coupling section and the second coupling section on a front edge thereof and houses therein an electronic component.

9 Claims, 12 Drawing Sheets

(56) References Cited

U.S. PATENT DOCUMENTS

| | | | | |
|---|---|---|---|---|
| 8,693,181 | B2* | 4/2014 | Tseng | G06F 1/1681 |
| | | | | 361/679.27 |
| 9,107,301 | B2* | 8/2015 | Pan | G06F 1/1698 |
| D869,458 | S* | 12/2019 | Tzou | D14/317 |
| 2003/0034952 | A1* | 2/2003 | Wang | G06F 1/1683 |
| | | | | 345/156 |
| 2003/0156382 | A1* | 8/2003 | Yukawa | G06F 1/16 |
| | | | | 361/679.22 |
| 2008/0112113 | A1* | 5/2008 | Sawadski | H04M 1/022 |
| | | | | 361/679.27 |
| 2010/0277860 | A1* | 11/2010 | Jeong | H04M 1/0216 |
| | | | | 361/679.27 |
| 2012/0162871 | A1* | 6/2012 | Tseng | G06F 1/1635 |
| | | | | 361/679.01 |
| 2013/0021738 | A1* | 1/2013 | Yang | G06F 1/1616 |
| | | | | 361/679.27 |
| 2013/0155598 | A1* | 6/2013 | Kontkanen | G06F 1/1616 |
| | | | | 361/679.27 |
| 2014/0347805 | A1* | 11/2014 | Wang | G06F 1/1616 |
| | | | | 361/679.27 |
| 2015/0138712 | A1* | 5/2015 | Solland | G06F 1/1652 |
| | | | | 361/679.27 |
| 2017/0090516 | A1* | 3/2017 | Ku | G06F 1/1669 |
| 2018/0024596 | A1* | 1/2018 | Park | E05D 3/122 |
| | | | | 361/679.55 |
| 2018/0046225 | A1* | 2/2018 | Amarilio | G06F 1/1601 |
| 2018/0210499 | A1* | 7/2018 | Tsubaki | E05D 3/12 |
| 2019/0129475 | A1* | 5/2019 | Lai | G06F 1/166 |
| 2019/0163241 | A1* | 5/2019 | Moon | G06F 1/1605 |
| 2019/0258301 | A1* | 8/2019 | Feliconio Pereira | |
| | | | | G06F 1/1688 |
| 2020/0281085 | A1* | 9/2020 | Jia | H04M 1/0214 |

* cited by examiner

ELECTRONIC APPARATUS

FIELD OF THE INVENTION

The present invention relates to an electronic apparatus which is configured by coupling together a plurality of chassis.

BACKGROUND OF THE INVENTION

An electronic apparatus such as a Laptop PC and so forth generally has a structure that a main body chassis on which a keyboard device is loaded and a display chassis on which a display is loaded are coupled together by a hinge device (see, for example, Japanese Unexamined Patent Application Publication No. 2016-134051).

SUMMARY OF THE INVENTION

Various requests such as speeding-up of wireless communications, improvement of sound quality and appearance quality and so forth are made to an electronic apparatus such as the above-mentioned apparatus. In order to cope with such requests, it is necessary to increase, for example, the installation number of antenna devices to be loaded and a box volume of a loudspeaker device or to narrow a bezel around the display. In that case, the thickness of the chassis of the electronic apparatus is increased and securing of a space for installation of various electronic components to be loaded becomes a problem to be solved.

The present invention has been made in view of the above-described problems of related art and aims to provide an electronic apparatus which is capable of attaining improvement of various functions and thinning of the chassis simultaneously.

An electronic apparatus according to the first aspect of the present invention includes a first chassis, a second chassis and a third chassis which is configured to have a first coupling section which is rotatably coupled with a rear edge of the first chassis and a second coupling section which is rotatably coupled with a rear edge of the second chassis and thereby to couple together the first chassis and the second chassis to be rotationally movable relatively, in which the third chassis is installed to project more rearward than the rear edges of the first chassis and the second chassis by having the first coupling section and the second coupling section on a front edge thereof and houses therein an electronic component.

The above-described aspect of the present invention can attain improvement of the various functions and thinning of the chassis simultaneously.

DETAILED DESCRIPTION OF THE INVENTION

In the following, electronic apparatuses pertaining to the present invention will be described in detail by giving a preferable embodiment and a modified example with reference to the appended drawings.

Figure 1:
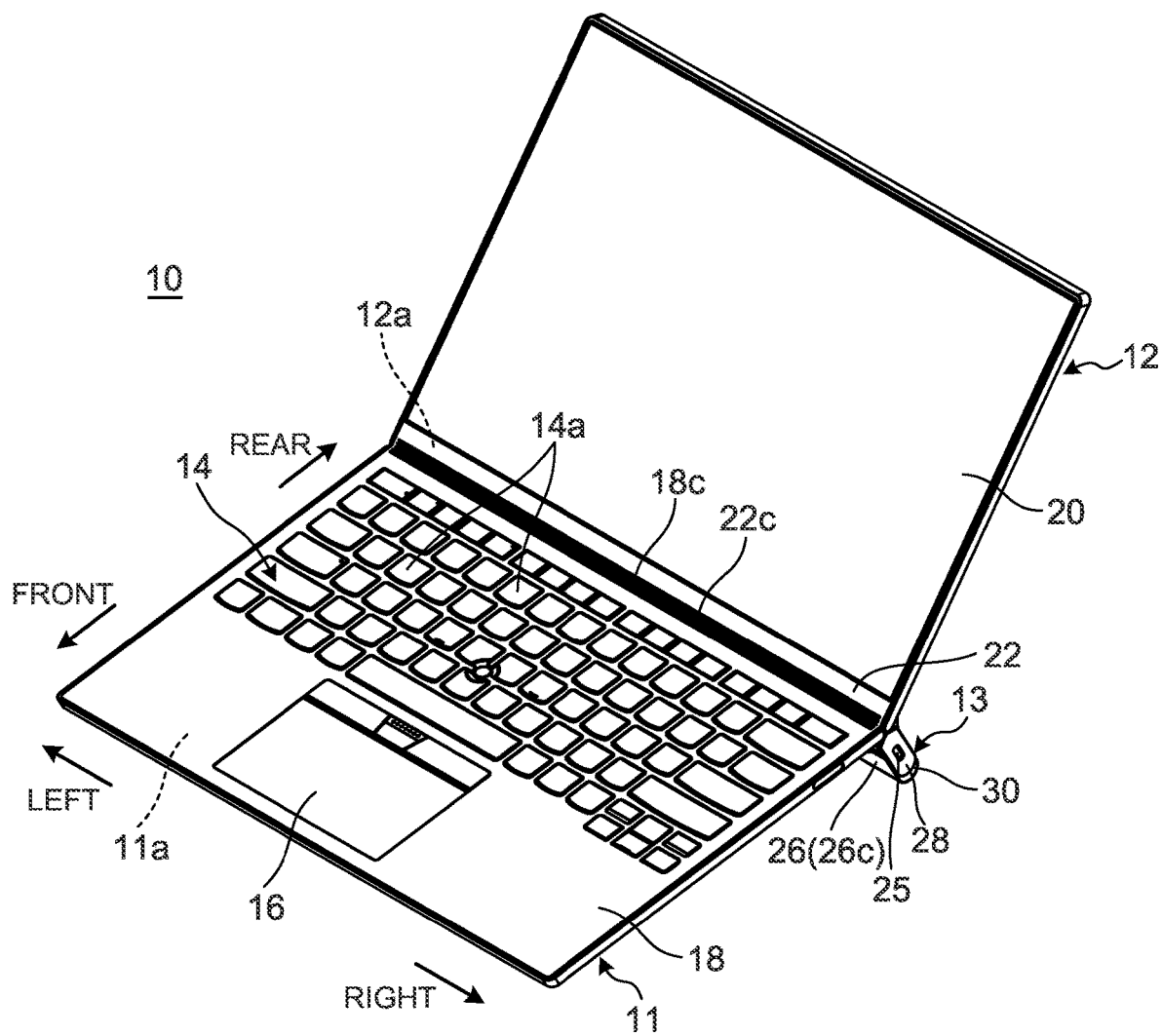
FIG. 1 is a perspective view illustrating one example of an electronic apparatus according to one embodiment of the present invention.
Figure 2:
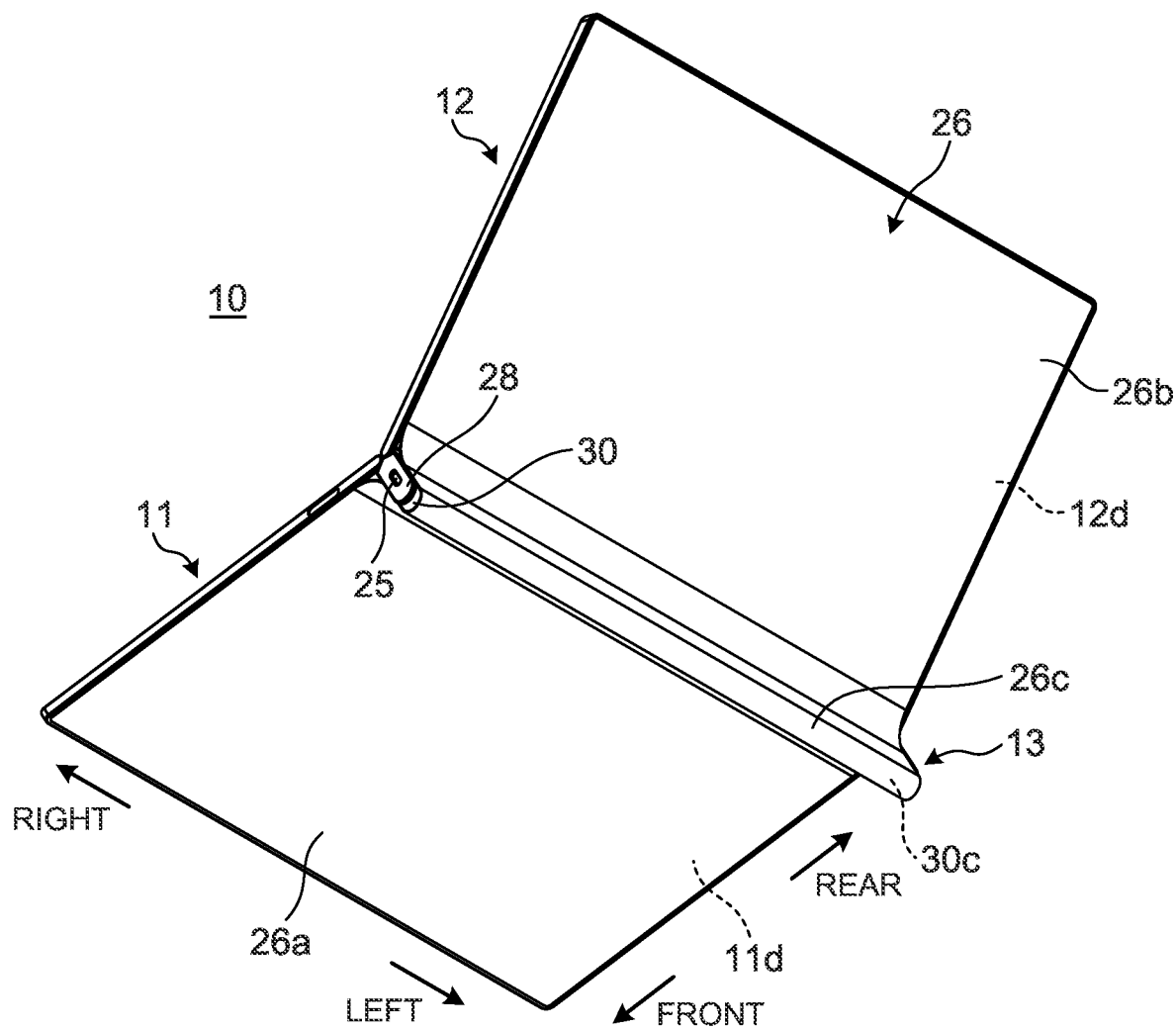
FIG. 2 is a perspective view illustrating one example of the electronic apparatus illustrated in FIG. 1 when viewing from the bottom side thereof.

FIG. 1 is a perspective view illustrating one example of an electronic apparatus 10 according to one embodiment of the present invention. FIG. 2 is a perspective view illustrating one example of the electronic apparatus 10 illustrated in FIG. 1 when viewing from the bottom side thereof. As illustrated in FIG. 1 and FIG. 2, the electronic apparatus 10 includes a first chassis 11, a second chassis 12 and a third chassis 13. The first chassis 11 and the second chassis 12 are coupled together to be rotationally movable relatively via the third chassis 13.

Figure 3:
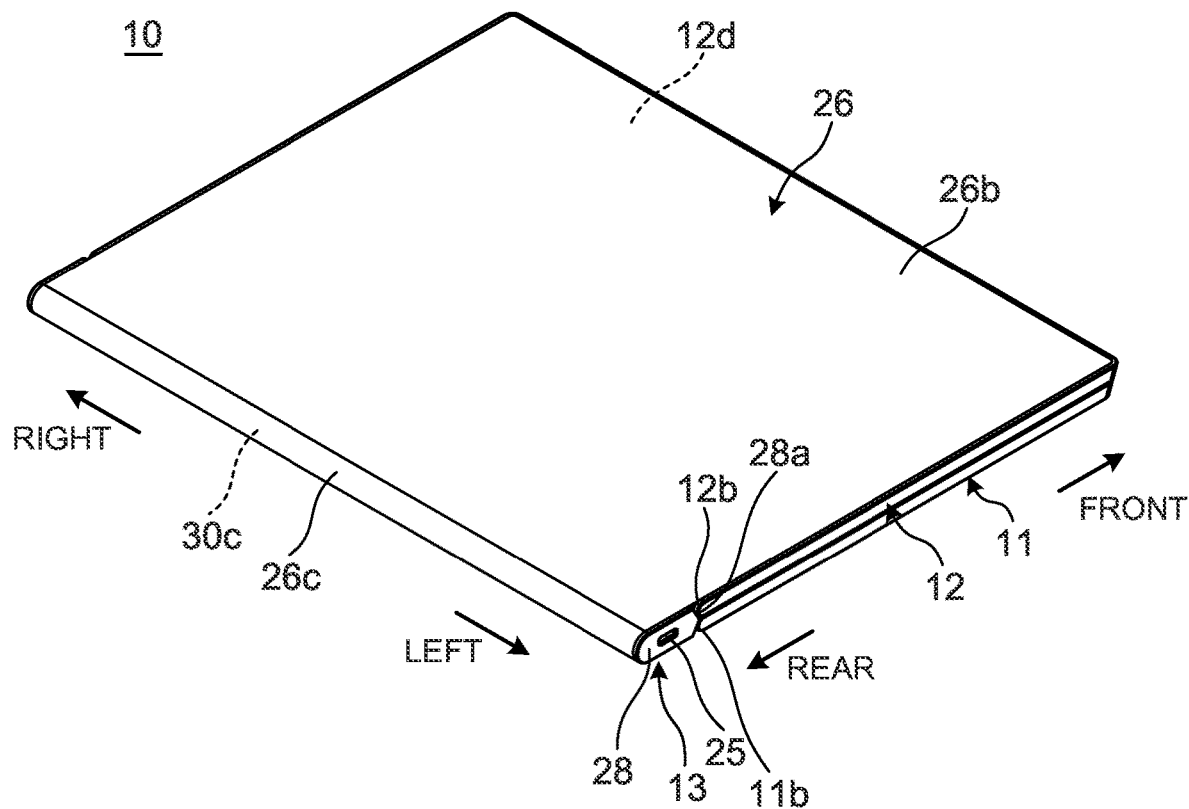
FIG. 3 is a perspective view illustrating one example of the electronic apparatus in FIG. 1 in a state of being brought into a zero-degree posture by mutually closing a first chassis and a second chassis.

FIG. 3 is a perspective view illustrating one example of the electronic apparatus 10 in a state of being brought into a zero-degree posture by mutually closing the first chassis 11 and the second chassis 12. In the following, description will be made by calling a depth direction of the respective first to third chassis 11 to 13 which are in the zero-degree posture illustrated in FIG. 3 as a front-rear direction, calling a width direction of the first to third chassis 11 to 13 as a left-right direction and calling a thickness direction of the first to third chassis 11 to 13 as a top-bottom direction in the electronic apparatus 10 unless otherwise particularly specified.

First, an overall configuration of the respective first to third chassis 11 to 13 will be described.

In a case of the present embodiment, the first and second chassis 11 and 12 are capable of rotationally moving from the zero-degree posture that the first and second chassis 11 and 12 mutually face to a 180-degree posture (see FIG. 9D) that the first and second chassis 11 and 12 are arranged side by side almost coplanar with each other. When the first and second chassis 11 and 12 are rotationally moved relatively, the third chassis 13 is moved by a rotational-movement angle which is half a rotational-movement angle between the first and second chassis 11 and 12 relative to each of the first and second chassis 11 and 12. For example, FIG. 1 illustrates a state of bringing the first and second chassis 11 and 12 into a 135-degree posture. That is, in the electronic apparatus 10 illustrated in FIG. 1, the third chassis 13 is in a state of being rotationally moved by 67.5 degrees relative to each of the first and second chassis 11 and 12 from the zero-degree posture. An upper limit of a rotational movement range between the first and second chassis 11 and 12 may be either smaller or larger than a rotational movement range attained in a case of taking, for example, a 180-degree posture.

The first chassis 11 is a thin box-shaped chassis. An electronic circuit board, a CPU (Central Processing Unit), a memory, a battery device and so forth which are not illustrated in the drawing are housed in the first chassis 11. The first chassis 11 has a keyboard device 14 and a touch pad 16 on a front face 11a which is located inside when the electronic apparatus 10 takes the zero-degree posture. Alternatively, a touch-panel type display may be installed on the front face 11a of the first chassis 11 and a software keyboard device may be displayed on the touch-panel type display. The front face 11a is covered with a first inner cover 18.

The first inner cover 18 is a thin and flexible cover member. The first inner cover 18 is formed of, for example, leather, artificial leather, a resin and so forth. The first inner cover 18 covers almost the entire surface of the front face 11a other than each keytop 14a and a touch pad 16. Alternatively, the first inner cover 18 may be configured to cover only part of the front face 11a, for example, only part which is located more rearward than the keytops 14a in the rearmost row.

The second chassis 12 is, for example, a box-shape chassis which is as thick as or is slightly thinner than the first chassis 11. The second chassis 12 has a display 20 on a front face 12a which is located inside when the electronic apparatus 10 takes the zero-degree posture. The display 20 is, for example, a liquid crystal display. A bezel part of the front face 12a which surrounds the display 20 is covered with a second inner cover 22.

The second inner cover 22 is formed of the same material as the first inner cover 18 and is a thin and flexible cover member. Alternatively, the second inner cover 22 may be configured to cover only part of the front face 12a, for example, only part which is located more rearward (a lower-side part in FIG. 1) than the display 20.

The third chassis 13 is a box-shape chassis which is thicker than the respective first and second chassis 11 and 12 and is short in front-rear direction dimension. The third chassis 13 is installed to project rearward from rear edges 11b and 12b of the respective first and second chassis 11 and 12. A front edge of the third chassis 13 is coupled with the respective first and second chassis 11 and 12 to be rotationally movable. The third chassis 13 mainly has two functions. A first function is a function that the third chassis 13 serves as a housing section which houses an electronic component 24 (see FIG. 5A). A second function is a function that the third chassis 13 serves as a hinge which couples together the first and second chassis 11 and 12 to be rotationally movable.

The electronic component 24 is one or a plurality of components such as, for example, a loudspeaker device, an electronic circuit board, an antenna device and an external connection terminal. In a case where the electronic component 24 is the loudspeaker device, it is possible to load a large-sized loudspeaker box which largely utilizes an internal volume of the third chassis 13. In a case where the electronic component 24 is the electronic circuit board, it is possible to load a control board for the display 20, a mother board of the electronic apparatus 10 and so forth. In a case where the electronic component 24 is the antenna device, it is possible to load the antenna device which copes with a wireless WAN and a wireless LAN. In particular, it is necessary to install, for example, four antenna devices in 5G (5-th Generation Mobile Communication System) via the wireless WAN. Therefore, since it is difficult to secure an installation space for the antenna devices in the first chassis 11 and the second chassis 12, it is preferable to load some of or all the antenna services on the third chassis 13. In a case where the electronic component 24 is the external connection terminal, it is preferable to load a connector section 25 on a side face of the third chassis 13. The connector section 25 is a section which conforms to, for example, the USB standards. The third chassis 13 functions as the housing section which houses one electronic component 24 or the plurality of the electronic components 24 in this way. Alternatively, the electronic component 24 may be, for example, a battery device and so forth.

Figure 4:
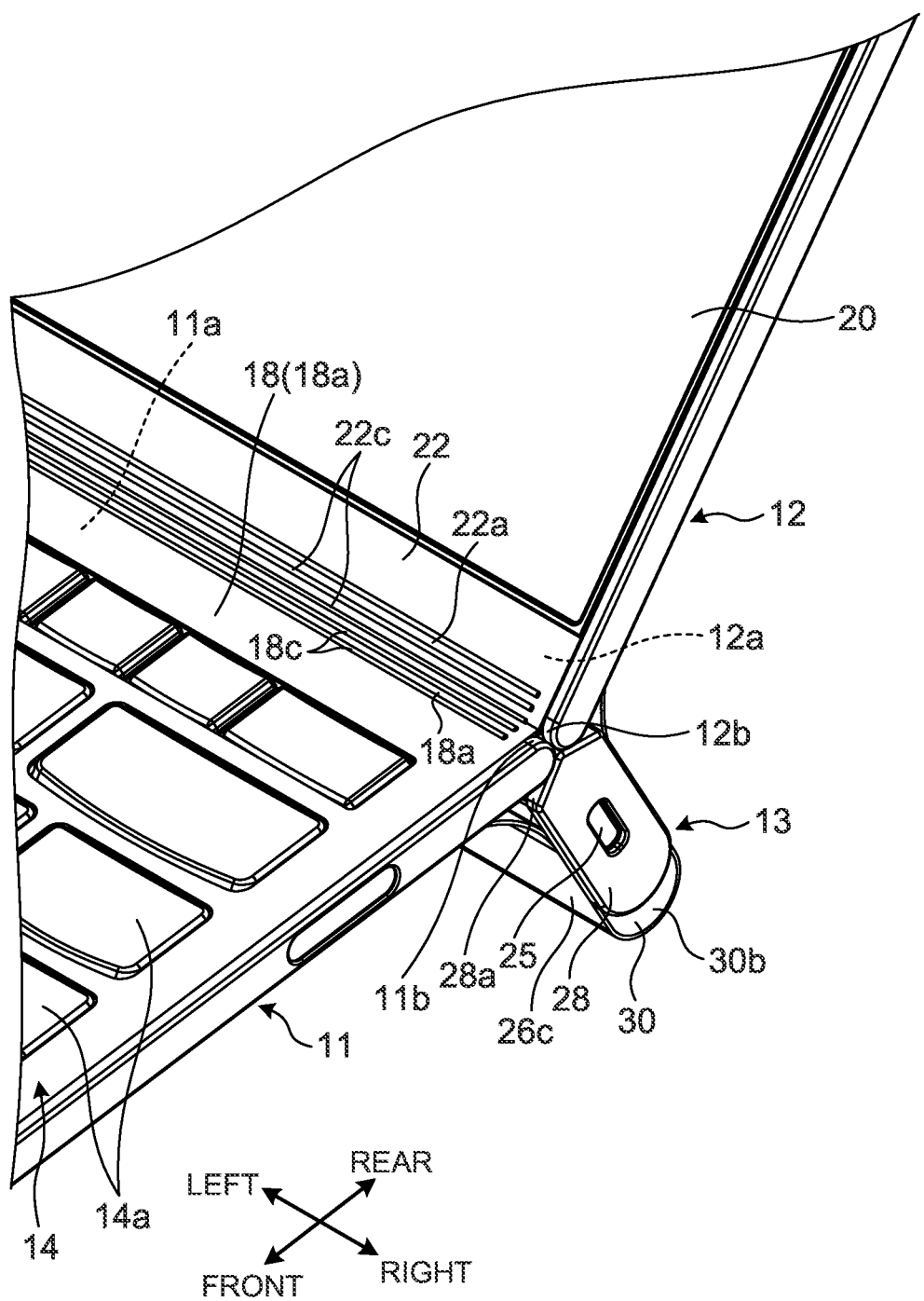
FIG. 4 is a perspective view illustrating, in an enlarged state, one example of coupled parts between the respective chassis concerned and their surroundings.
Figure 5A:
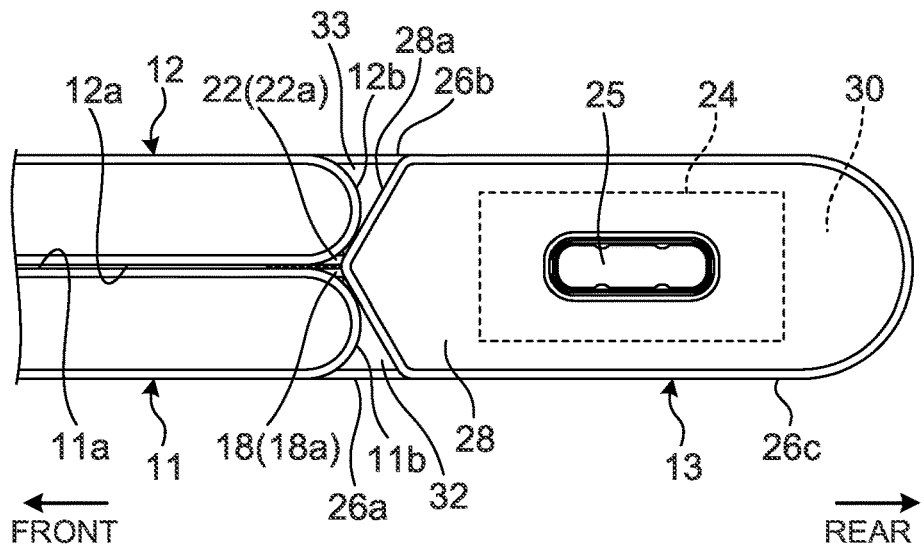
FIG. 5A is a side view illustrating, in the enlarged state, one example of the coupled parts between the respective chassis concerned and their surroundings in the zero-degree posture.
Figure 5B:
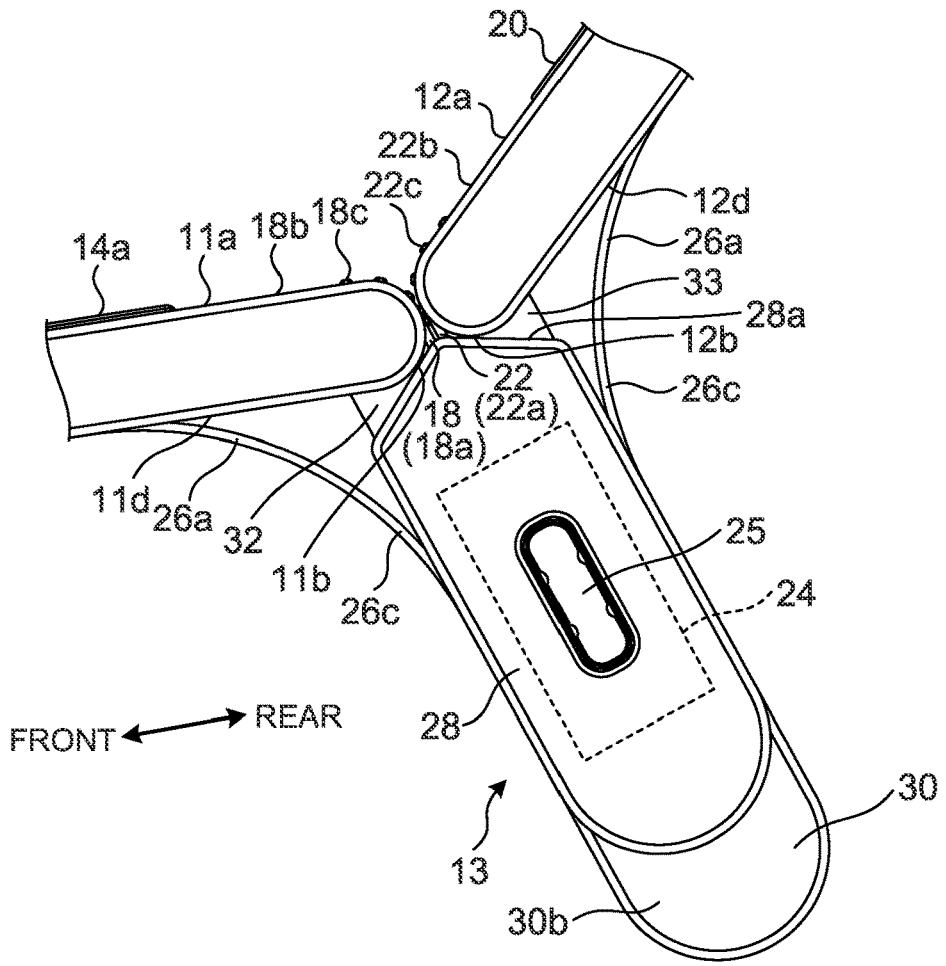
FIG. 5B is a side view illustrating, in the enlarged state, one example of the coupled parts between the respective chassis concerned and their surroundings in a 135-degree posture.
Figure 6:
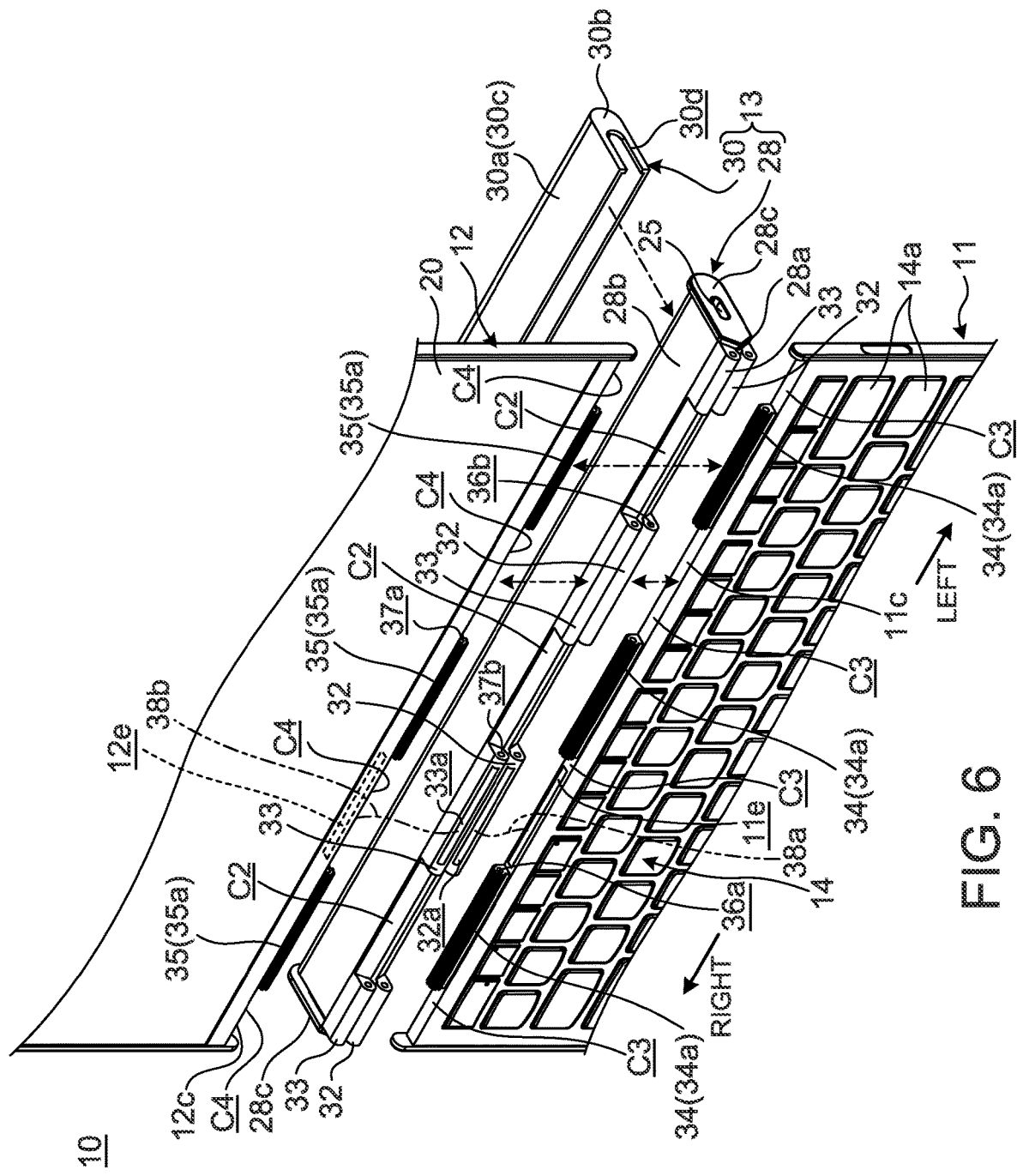
FIG. 6 is an exploded perspective view illustrating, in the enlarged state, one example of the coupled parts between the respective chassis concerned.
Figure 7:
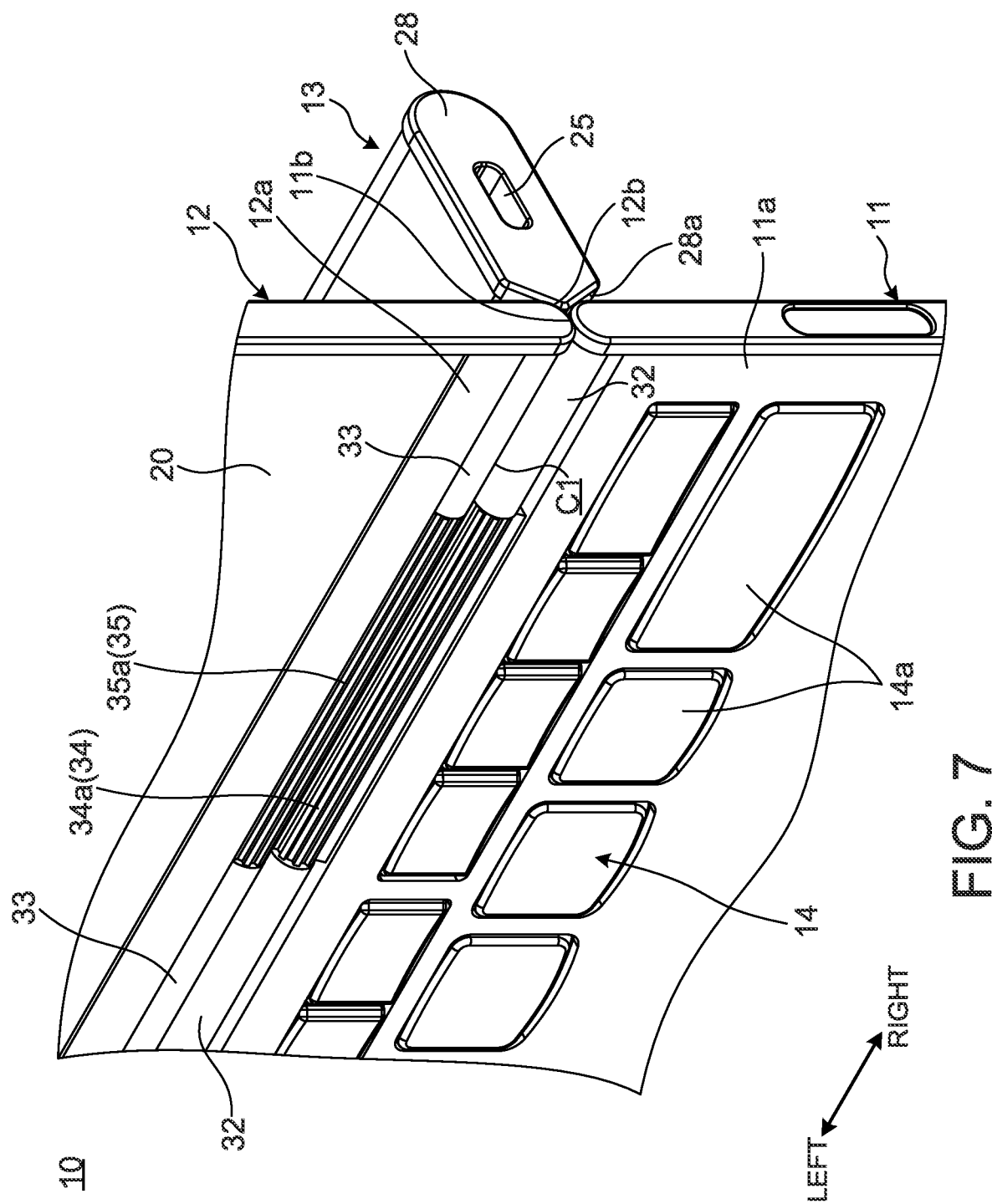
FIG. 7 is a partially enlarged perspective view illustrating one example of a state where the respective chassis illustrated in FIG. 6 are coupled together.

Next, a configuration example of the third chassis 13 and configuration examples of coupled parts between the third chassis 13 and the first chassis 11 and between the third chassis 13 and the second chassis 12 will be described. FIG. 4 is a perspective view illustrating, in an enlarged state, one example of coupled parts between the first and third chassis 11 and 13 and between the second and third chassis 12 and 13, and their surroundings. FIG. 5A is a side view illustrating, in the enlarged state, one example of the coupled parts between the first and third chassis 11 and 13 and between the chassis 12 and 13, and their surroundings in the zero-degree posture. FIG. 5B is a side view illustrating, in the enlarged state, one example of the coupled parts between the first and third chassis 11 and 13 and between the chassis 12 and 13, and their surroundings in a 135-degree posture. FIG. 6 is an exploded perspective view illustrating, in the enlarged state, one example of the coupled parts between the first and third chassis 11 and 13 and between the chassis 12 and 13. FIG. 7 is a partially enlarged perspective view illustrating one example of a state where the respective first to third chassis 11 to 13 illustrated in FIG. 6 are coupled together. Incidentally, in FIG. 6 and FIG. 7, illustration of the first and second inner covers 18 and 22 and an outer cover 26 which will be described later is omitted.

As illustrated in FIG. 4 to FIG. 7, the third chassis 13 includes a chassis coupling section 28 and a cover fixing section 30. Incidentally, in FIG. 7, illustration of the cover fixing section 30 is omitted.

The chassis coupling section 28 is a section which is coupled with the respective first and second chassis 11 and 12 to be rotationally movable. The electronic component 24 is housed in the chassis coupling section 28. A connector section 25 is opened in the side face of the chassis coupling section 28. The chassis coupling section 28 is supported to the cover fixing section 30 to be relatively slidable in the front-rear direction relative.

As illustrated in FIG. 6 and FIG. 7, a first coupling section 32 and a second coupling section 33 are installed on a front edge 28a of the chassis coupling section 28. The first coupling section 32 is a bearing section which is coupled with a first coupling gear section 34 of the first chassis 11 to be rotationally movable. The second coupling section 33 is a bearing section which is coupled with a second coupling gear section 35 of the second chassis 12 to be rotationally movable.

The first and second coupling sections 32 and 33 are projection-like sections which are vertically arrayed in a thickness direction of the third chassis 13, project forward from the front edge 28a of the chassis coupling section 28 and have arc-shaped leading ends. In the case of the present embodiment, the first coupling section 32 is arranged under the second coupling section 33 with a slight space C1 (see FIG. 8) being interposed between the first and second coupling sections 32 and 33. A plurality of sets of the first and second coupling sections 32 and 33 which are vertically arrayed are installed. The respective sets of the first and second coupling sections 32 and 33 are arrayed along the left-right direction with a space C2 being interposed between the mutually adjacent sets of the first and second coupling sections 32 and 33 (see FIG. 6).

As illustrated in FIG. 6 and FIG. 7, the first coupling gear section 34 is a projection-like section which projects rearward from a rear end face 11c which is formed on the rear edge 11b of the first chassis 11 and has an arc-shaped leading end. A plurality of the first coupling gear sections 34 is installed and arrayed along the left-right direction with a space C3 being interposed between the mutually adjacent first coupling gear sections 34. The spaces C3 are formed between an outer end face of the left-end first coupling gear section 34 and a left side face of the first chassis 11 and between an outer end face of the right-end first coupling gear section 34 and a right side face of the first chassis 11.

A left-right direction width dimension of each first coupling gear section 34 is slightly smaller than a left-right direction width dimension of each space C2 on the corresponding third chassis 13 side. Therefore, the first coupling gear section 34 is inserted into the space C2 (see FIG. 7). In addition, a left-right direction width dimension of each set of the first and second coupling sections 32 and 33 is slightly smaller than a left-right direction width dimension of each space C3 on the corresponding first chassis 11 side. Therefore, the first coupling section 32 is inserted into the space C3 concerned (see FIG. 7).

Figure 8:
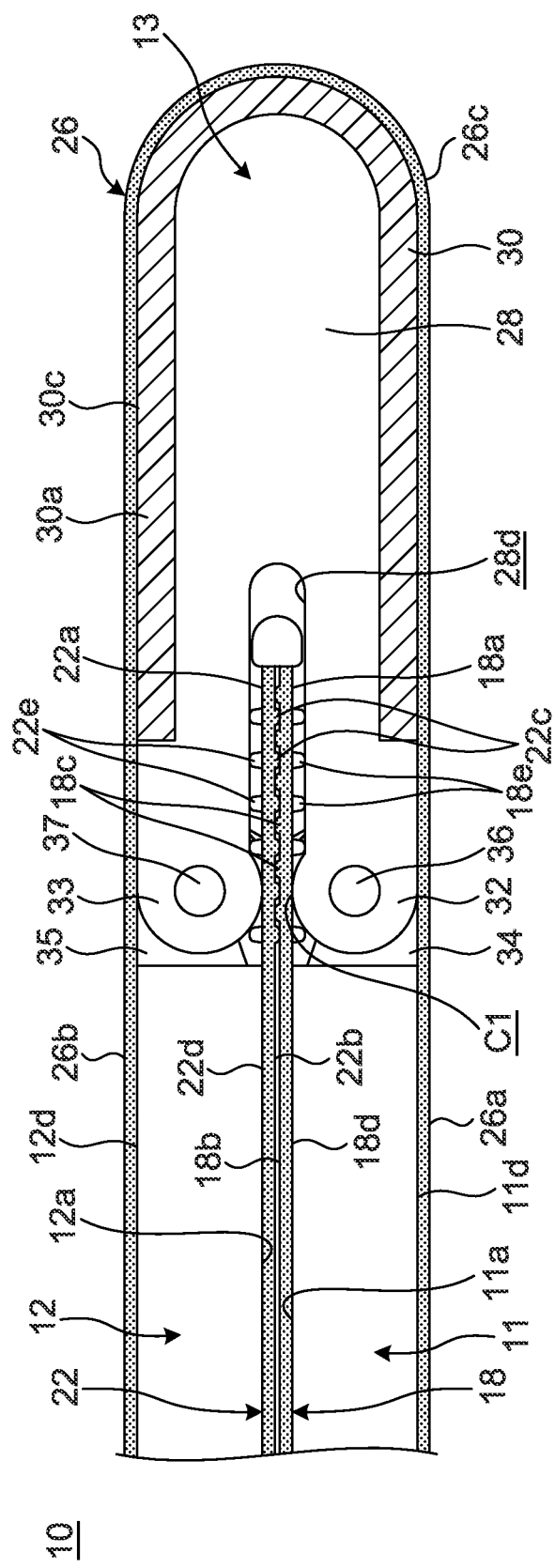
FIG. 8 is a side sectional diagram illustrating one example of part of the electronic apparatus in FIG. 1 which is taken along a cutting plane line passing through a first coupling section and a second coupling section in the zero-degree posture.

A shaft 36 which serves as a rotating shaft is projectingly installed on a side face of the first coupling gear section 34 which faces the space C3 (see FIG. 8). One end of the shaft 36 is fitted into, for example, a fitting hole 36a (see FIG. 6) which is formed in a side face of the first coupling gear section 34. The other end of the shaft 36 is rotatably supported in a shaft hole 36b (see FIG. 6) which is formed in a side face of the first coupling section 32 which faces the space C2. As a result, the first coupling gear section 34 and the first coupling section 32 are coupled together to be relatively rotatable and thereby the first chassis 11 and the third chassis 13 are coupled together to be rotationally movable relatively.

As illustrated in FIG. 6 and FIG. 7, the second coupling gear section 35 is a projection-like section which projects rearward from a rear end face 12c which is formed on the rear edge 12b of the second chassis 12 and has an arc-shaped leading end. A plurality of the second coupling gear sections 35 is installed and arrayed along the left-right direction with a space C4 being interposed between the mutually adjacent second coupling gear sections 35. The spaces C4 are formed between an outer end face of the left-end second coupling gear section 35 and a left side face of the second chassis 12 and between an outer end face of the right-end second coupling gear section 35 and a right side face of the second chassis 12. A left-right direction width dimension of each second coupling gear section 35 is the same as a left-right direction width dimension of each first coupling gear section 34. Also, a left-right direction width dimension of the space C4 is the same as the left-right width dimension of the space C3. Therefore, each second coupling gear section 35 is inserted into the space C2 on the corresponding third chassis 13 side (see FIG. 7). In addition, the second coupling section 33 is inserted into the space C4 concerned (see FIG. 7).

A shaft 37 which serves as a rotating shaft is projectingly installed on a side face of the second coupling gear section 35 which faces the space C4 (see FIG. 8). One end of the shaft 37 is fitted into, for example, a fitting hole 37a (see FIG. 6) which is formed in a side face of the second coupling gear section 35. The other end of the shaft 37 is rotatably supported in a shaft hole 37b (see FIG. 6) which is formed in a side face of the second coupling section 33 which faces the space C2. As a result, the second coupling gear section 35 and the second coupling section 33 are coupled together to be relatively rotatable and thereby the second chassis 12 and the third chassis 13 are coupled together to be rotationally movable relatively.

As illustrated in FIG. 5A to FIG. 6, a cover fixing section 30 is a member which is formed into an almost U-shape in a side view. The cover fixing section 30 is installed so as to cover the chassis coupling section 28 from rear. The cover fixing section 30 has an outer wall part 30a and a side wall part 30b.

The outer wall part 30a is a plate part which is shaped into a U-shape. The outer cover 26 which will be described later is fixed to an outer face 30c of the outer wall part 30a. The side wall part 30b is installed so as to cover part of a side-face opening of the outer wall part 30a. The side wall part 30b is formed into the U-shape in the side view by having a notch 30d which is opened forward.

The cover fixing section 30 is overlaid onto the chassis coupling section 28 from rear. Thus, the cover fixing section 30 contains a main body 28b of the chassis coupling section 28 on the inner side of the outer wall part 30a. On this occasion, the notch 30d of the side wall part 30b is fitted onto the main body 28b on the inner side of a side plate 28c of the chassis coupling section 28. The side plate 28c is a plate part which is installed on each of left and right ends of the main body 28b and has an external form which is a size lager than the main body 28b. The cover fixing section 30 is slidable relative to the chassis coupling section 28 in the front-rear direction owing to relative sliding between the notch 30d and the main body 28b.

Next, a configuration example of the outer cover 26 will be described.

As illustrated in FIG. 2 and FIG. 3, the outer cover 26 continuously covers the first to third chassis 11 to 13, ranging from a back face 11d of the first chassis 11 to a back face 12d of the second chassis 12 via the outer face 30c (of the cover fixing section 30) of the third chassis 13. That is, the outer cover 26 seamlessly covers the back faces 11d and 12d and the outer face 30c of the respective first to third chassis 11 to 13. The outer cover 26 is a thin and flexible cover member which is formed of, for example, a material which is the same as the material of the first and second inner covers 18 and 22. Incidentally, it is sufficient for the outer cover 26 to cover at least part of each of the back faces 11d and 12d and the outer face 30c. The outer cover 26 may be configured to have a width which is slightly narrower than the width of the back face 11d and so forth, for example, in the left-right direction so as to expose the back face 11d and so forth to the outside at both ends thereof. The back faces 11d and 12d and the outer face 30c are faces which form an outer face of the electronic apparatus 10 when the zero-degree posture is taken.

The outer cover 26 has a first cover part 26a, a second cover part 26b and a third cover part 26c. The first cover part 26a is a part which covers the back face 11d of the first chassis 11. The second cover part 26b is a part which covers the back face 12d of the second chassis 12. The third cover part 26c is a part which covers the outer face 30c of the cover fixing section 30 of the third chassis 13. The respective first to third cover parts 26a, 26b and 26c are fixed to the back faces 11d and 12d and the outer face 30c respectively with double sided tape, an adhesive and so forth.

As illustrated in FIG. 5A and FIG. 5B, the outer cover 26 is not fixed to the back face 11d and the outer face 30c and is in a free state at a boundary part between the first cover part 26a and the third cover part 26c (also see FIG. 2 and FIG. 3). Likewise, the outer cover 26 is not fixed to the back face 12d and the outer face 30c and is in the free state at a boundary part between the second cover part 26b and the third cover part 26c.

Figure 9A:
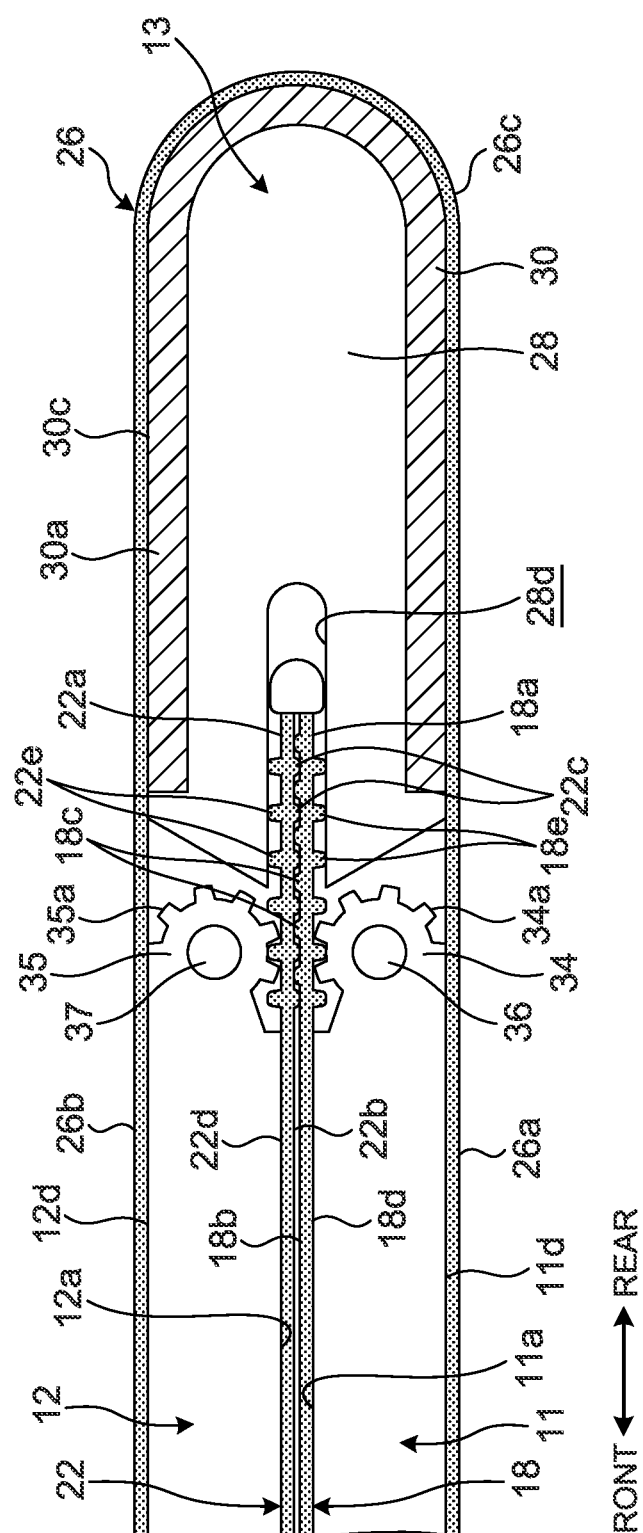
FIG. 9A is a side sectional diagram illustrating one example of part of the electronic apparatus in FIG. 1 which is taken along a cutting plane line passing through a first coupling gear section and a second coupling gear section in the zero-degree posture.

Next, a relation among the first and second inner covers 18 and 22 and the third chassis 13 will be described. FIG. 8 is a side sectional diagram illustrating one example of part of the electronic apparatus which is taken along a cutting plane line passing through the respective first and second coupling sections 32 and 33 in the zero-degree posture. FIG. 9A is a side sectional diagram illustrating one example of part of the electronic apparatus which is taken along a cutting plane line passing through the respective first and second coupling gear sections 34 and 35 in the zero-degree posture. In FIG. 8 and FIG. 9A, illustration is made by omitting hatching which indicates cross sections of the respective first to third chassis 11 to 13 except the first and second inner covers 18 and 22, the outer cover 26 and the cover fixing section 30 and the same also applies to the examples in FIG. 9B to FIG. 9D, FIG. 10A and FIG. 10B.

As illustrated in FIG. 7 and FIG. 9A, a first gear part 34a is formed on an outer circumferential face of the first coupling gear section 34. A second gear part 35a is formed on an outer circumferential face of the second coupling gear section 35. The respective first and second gear parts 34a and 35b rotate in opposite directions in synchronization with each other via the first and second inner covers 18 and 22.

As illustrated in FIG. 4, FIG. 8 and FIG. 9A, the first inner cover 18 has a first front gear part 18c on a front face 18b of a rear edge 18a and has a first back gear part 18e on a back face 18d thereof. The first front gear part 18c is configured by arraying and fixing a plurality of thin and rectangular stick-shaped members which extends in the left-right direction onto the front face 18b at equal intervals in the front-rear direction. The first back gear part 18e has almost the same structure as the first front gear part 18c excepting a point that stick-shaped members of the first back gear part 18e are higher than the stick-shaped members of the first front gear part 18c. The first back gear part 18e is engaged with the first gear part 34a and thereby functions just like a rack gear.

As illustrated in FIG. 8 and FIG. 9A, the second inner cover 22 has a second front gear part 22c on a front face 22b of a rear edge 22a and has a second back gear part 22e on a back face 22d of the rear edge 22a. The second front gear part 22c is the same as the first front gear part 18c in structure. The respective first and second front gear parts 18c and 22c are engaged with each other in a state of being out of positional alignment with each other in the front-rear direction. The second back gear part 22e is the same as the first back gear part 18e in structure. The second back gear part 22e is engaged with the second gear part 35a and thereby functions just like the rack gear.

As illustrated in FIG. 8 and FIG. 9A to FIG. 9E, the rear edges 18a and 22a of the first and second inner covers 18 and 22 are mutually superposed and are in the free states relative to the respective first and second chassis 11 and 12. The rear edges 18a and 22a pass through the space C1 between the first and second coupling sections 32 and 33 and a space between the first and second coupling gear sections 34 and 35 and enter the inside of the third chassis 13. An opening groove 28d which is opened forward and extends in the front-rear direction is formed in the chassis coupling section 28 of the third chassis 13. The rear edges 18a and 22a of the first and second inner covers 18 and 22 are inserted into the opening groove 28d to be retractable.

The first and second inner covers 18 and 22 are integrally configured by mutual engagement of the first and second front gear parts 18c and 22c and are made retractable relative to the third chassis 13 in this way. On the other hand, the first back gear part 18e is engaged with the first gear part 34a of the first chassis 11 and the second back gear part 22e is engaged with the second gear part 35a of the second chassis 12 respectively. Thereby, in the electronic apparatus 10, the first gear part 34a of the first chassis 11 is engaged with the second gear part 35a of the second chassis 12 via the respective gear parts 18c, 18e, 22c and 22e and rotate in the opposite directions in synchronization with each other.

As illustrated in FIG. 6, an opening 11e is formed in the rear end face 11c of the first chassis 11. An opening 12e which is the same as the opening 11e is also formed in the rear end face 12c of the second chassis 12. In addition, openings 32a and 33a are formed in some (or all) sets of the first and second coupling sections 32 and 33 at positions which correspond to the positions of the openings 11e and 12e. For example, a flexible board 38a which is wiring running from the electronic component in the first chassis 11 to the electronic component 24 in the third chassis 13 is inserted into the openings 11e and 32a. For example, a flexible board 38b which is wiring running from the electronic component in the second chassis 12 to the electronic component 24 in the third chassis 13 is inserted into the openings 12e and 33a. Thereby, in the electronic apparatus 10, the respective first to third chassis 11 to 13 are electrically connected with one another. Incidentally, the openings 11e, 12e, 32a and 33a are covered with the first and second inner covers 18 and 22 (see FIG. 1 and FIG. 4) and therefor are not exposed to the outside of the electronic apparatus 10.

Figures 9B, 9C:
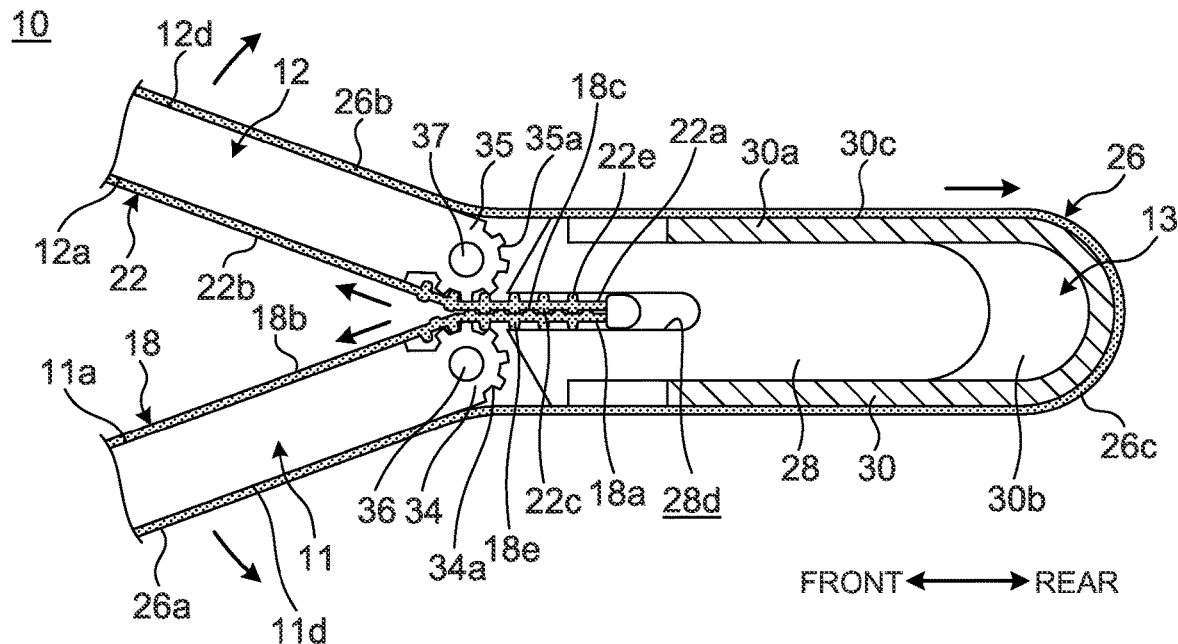
FIG. 9B is a side sectional diagram illustrating one example of the part of the electronic apparatus illustrated in FIG. 9A in a state of being brought into a 40-degree posture.
FIG. 9C is a side sectional diagram illustrating one example of the part of the electronic apparatus illustrated in FIG. 9B in a state of being brought into a 100-degree posture.

Next, operations of the electronic apparatus 10 will be described. FIG. 9B to FIG. 9E are side-face sectional diagrams illustrating examples of operating states of respective sections when the first and second chassis 11 and 12 are rotationally moved relatively from the state illustrated in FIG. 9A. Incidentally, FIG. 9B illustrates a state where the electronic apparatus 10 takes a 40-degree posture and FIG. 9C illustrates a state where the electronic apparatus 10 takes a 100-degree posture.

First, as illustrated in FIG. 9A, a state where the zero-degree posture is established between the first and second chassis 11 and 12 will be described. In this state, the front faces 11a and 12a of the first and second chassis 11 and 12, that is, the front faces 18b and 22b of the first and second inner covers 18 and 22 mutually face. The third chassis 13 is in a posture that the third chassis 13 projects rearward from the rear edges 11b and 12b of the first and second chassis 11 and 12. As illustrated in FIG. 3, FIG. 8 and FIG. 9A, the thickness of the third chassis 13 in the present embodiment is set so as to become the same as or almost the same as a total thickness that the thickness of the first chassis 11 and the thickness of the second chassis 12 are added together. Accordingly, it becomes possible for the third chassis 13 to largely secure a housing space for the electronic component 24 by utilizing its thickness which is thicker than the thicknesses of the other chassis 11 and 12. In particular, in a case where the loudspeaker device is used as the electronic component 24, it becomes possible to install the loudspeaker box thereof in a large volume in the third chassis 13.

Accordingly, the electronic apparatus 10 is thinned to an almost single-plate state similarly to a general Laptop PC in the zero-degree posture. In particular, in the present embodiment, the back faces 11d and 12d and the outer face 30c of the respective first to third chassis 11 to 13 are continuously covered with one outer cover 26. Therefore, in the electronic apparatus 10, seams between the first and third chassis 11 and 13 and between the second and third chassis 12 and 13 are not exposed to the outside in the zero-degree posture and thereby the external appearance of high quality is obtained (see FIG. 3).

Next, an operation of mutually opening the first and second chassis 11 and 12 from the zero-degree posture to the 180-degree posture illustrated in FIG. 9D will be described. In this opening operation, for example, the first chassis 11 and the second chassis 12 are held with hands and opened in the opposite directions. Then, the first chassis 11 rotationally moves relative to the third chassis 13 with the shaft 36 being set as the rotationally moving shaft. The second chassis 12 rotationally moves relative to the third chassis 13 with the shaft 37 being set as the rotationally moving shaft.

When this opening operation is performed, as illustrated in FIG. 9A to FIG. 9D, the first gear part 34a of the first chassis 11 rotates in a counterclockwise direction in the drawings. On the other hand, the second gear part 35a of the second chassis 12 rotates in a clockwise direction in the drawings. As described above, these first and second gear parts 34a and 35a are in a state of being engaged with each other via the respective gear parts 18c, 18e, 22e and 22c of the respective first and second inner covers 18 and 22. Therefore, the first chassis 11 and the second chassis 12 rotationally move in synchronization with each other and a rotational movement angle between the first and second chassis 11 and 12 is gradually increased. The third chassis 13 rotationally moves relative to the respective first and second chassis 11 and 12 at a rotational movement angle which is half the rotational movement angle between the first and second chassis 11 and 12.

An operation of the outer cover 26 when performing the opening operation will be described. In the outer cover 26, a boundary part between parts which cover the first chassis 11 and the third chassis 13 respectively is located more inward than the shaft 36 which is the rotational movement center between the first and third chassis 11 and 13 in a rotational movement direction. That is, a boundary part between the first cover part 26a and the third cover part 26c to be bent is located on the inner side of the rotational movement center between the first and third chassis 11 and 13. Accordingly, a boundary part between the first and third cover parts 26a and 26c receives compressive force which is generated due to a difference in circumferential length which occurs due to a difference in inner wheel when rotational movement is performed. That is, the first cover part 26a exhibits a tendency to move toward the third cover part 26c side and the third cover part 26c exhibits a tendency to move toward the first cover part 26a side. Likewise, in the outer cover 26, a boundary part between parts which cover the second chassis 12 and the third chassis 13 respectively, that is, also, a boundary part between the second cover part 26b and the third cover part 26c receives the compressive force when the rotational movement is performed. As a result, in the outer cover 26, the above-described two boundary parts exhibit a tendency to bend and rise.

However, in the electronic apparatus 10, it is possible to absorb the compressive force which acts on the outer cover 26 by the third chassis 13 and thereby to suppress bending and rising which would occur at the above-mentioned two boundary parts. That is, in the third chassis 13, when the outer cover 26 receives the compressive force when the opening operation is performed, the compressive force acts on the cover fixing section 30 which is fixed to the outer cover 26. As a result, the cover fixing section 30 receives force from the outer cover 26, is pushed rearward relative to the chassis coupling section 28 and slides (see FIG. 9B to FIG. 9D). That is, a positional relation of the chassis coupling section 28 with the respective first and second chassis 11 and 12 is fixed via the shafts 36 and 37. Therefore, the compressive force which acts on the outer cover 26 acts on the cover fixing section 30 which is fixed to the third cover part 26c and moves the cover fixing section 30 relative to the chassis coupling section 28. Accordingly, in the electronic apparatus 10, occurrence of bending and rising on the outer cover 26 is suppressed when the opening operation is performed (see FIG. 9B to FIG. 9D).

Operations of the first and second inner covers 18 and 22 when the opening operation is performed will be described. The rear edge 18a of the first inner cover 18 is located on the outer side of the shaft 36 which is the rotational movement center between the first and third chassis 11 and 13 in the rotational movement direction. Therefore, the first inner cover 18 receives tensile force which is generated due to a difference in circumferential length which occurs due to the difference in inner wheel when the rotational movement is performed. Likewise, also, the rear edge 22a of the second inner cover 22 receives the tensile force when the rotational movement is performed. As a result, there is a fear that the first and second inner covers 18 and 22 may extend and may be plastically deformed by receiving the above-described tensile force and thus may not return to their original states.

However, in the electronic apparatus 10, it is possible to release the tensile force which acts on the first and second inner covers 18 and 22. That is, in the first inner cover 18, the first back gear part 18c receives driving force from the first gear part 34a when the rotational movement is performed. Therefore, the first inner cover 18 exhibits a tendency to move in an advancing direction relative to the front face 11a of the first chassis 11. On the other hand, in the second inner cover 22, the second back gear part 22e receives the driving force from the second gear part 35a. Therefore, also, the second inner cover 22 exhibits a tendency to move in an advancing direction relative to the front face 12a of the second chassis 12. That is, the rear edges 18a and 22a of the first and second inner covers 18 and 22 are located on the rearmost side in the opening groove 28d in the zero-degree posture (see FIG. 9A). Then, the rear edges 18a and 22a gradually move forward in the opening groove 28d in association with the opening operation and reach the frontmost side in the 180-degree posture (see FIG. 9D). Therefore, the tensile force which acts on the first and second inner covers 18 and 22 is absorbed by forward movement of the rear edges 18a and 22a. As a result, as illustrated in FIG. 9B to FIG. 9D, when the opening operation is performed, plastic deformation of the first and second inner covers 18 and 22 due to acting of excessive tensile force on the first and second inner covers 18 and 22 is suppressed.

Figure 9D:
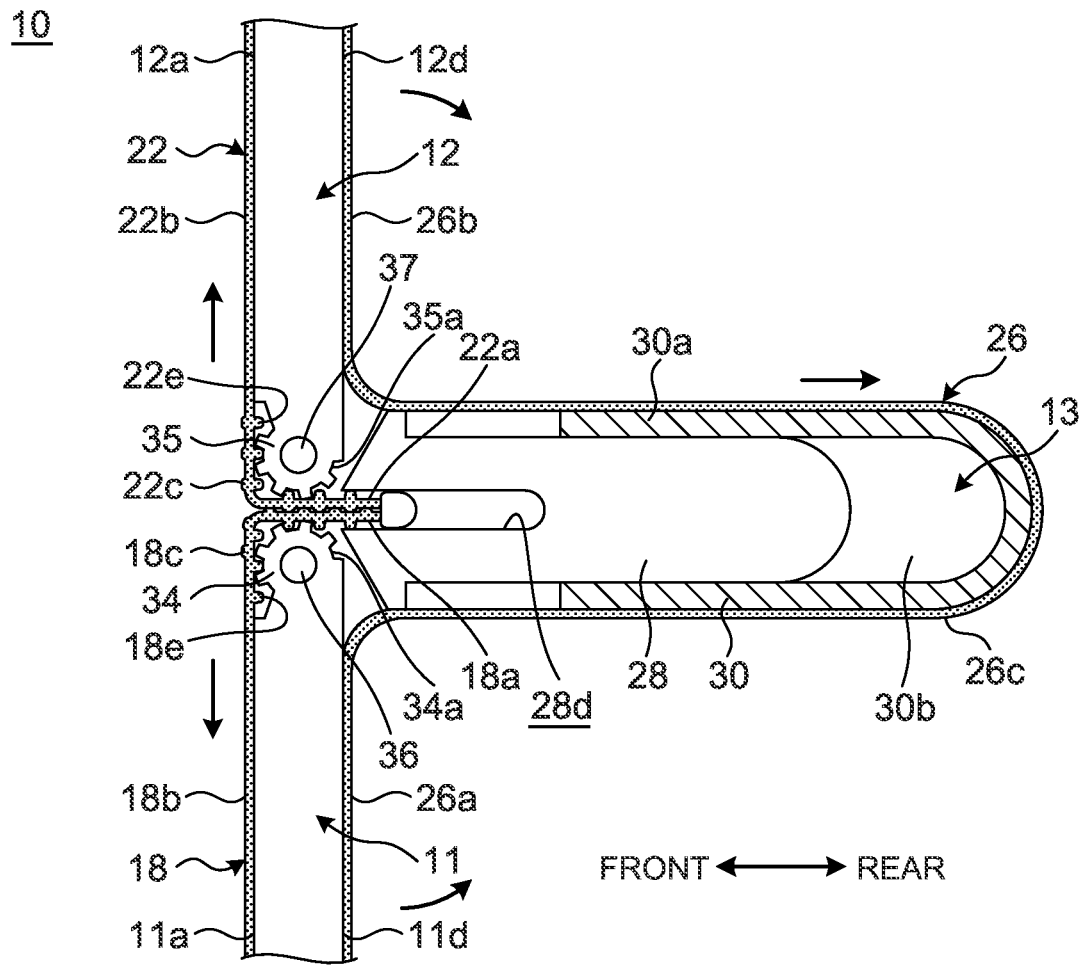
FIG. 9D is a side sectional diagram illustrating one example of the part of the electronic apparatus illustrated in FIG. 9C in a state of being brought into a 180-degree posture.

It is possible to utilize the electronic apparatus 10 in the same manner as the general Laptop PC in the postures illustrated in FIG. 9C and FIG. 9D in this way. On that occasion, the first chassis 11 which is installed on an installation surface such as a desk and so forth takes a posture that the rear edge 18a of the first inner cover 18 is slightly lifted upward by the third chassis 13 (see FIG. 1). Therefore, in the electronic apparatus 10, the first chassis 11 takes an appropriately angled posture that the front of the first chassis 11 is lowered and thereby operability of the keyboard device 14 is improved. In addition, in each angled posture, the front faces 11a and 12a of the first and second chassis 11 and 12 and the back faces 11d and 12d and the outer face 30c of the first to third chassis 11 to 13 are covered with the first and second inner covers 18 and 22 and the outer cover 26 respectively. Then, occurrence of bending and deformation of the first and second inner covers 18 and 22 and the outer cover 26 is suppressed in any angled posture and the external appearance of high quality is obtained.

When performing a closing operation that the posture is returned from the 180-degree posture illustrated in FIG. 9D to the zero-degree posture illustrated in FIG. 9A, the above-described operations are performed in reverse order. That is, in association with mutual closing of the first and second chassis 11 and 12, the cover fixing section 30 of the third chassis 13 is drawn forward by the outer cover 26. In addition, in association with mutual closing of the first and second chassis 11 and 12, the rear edges 18a and 22a of the first and second inner covers 18 and 22 move rearward in the opening groove 28d. Then, the electronic apparatus 10 returns to the zero-degree posture and goes back to the state illustrated in FIG. 9A.

Figure 10A:
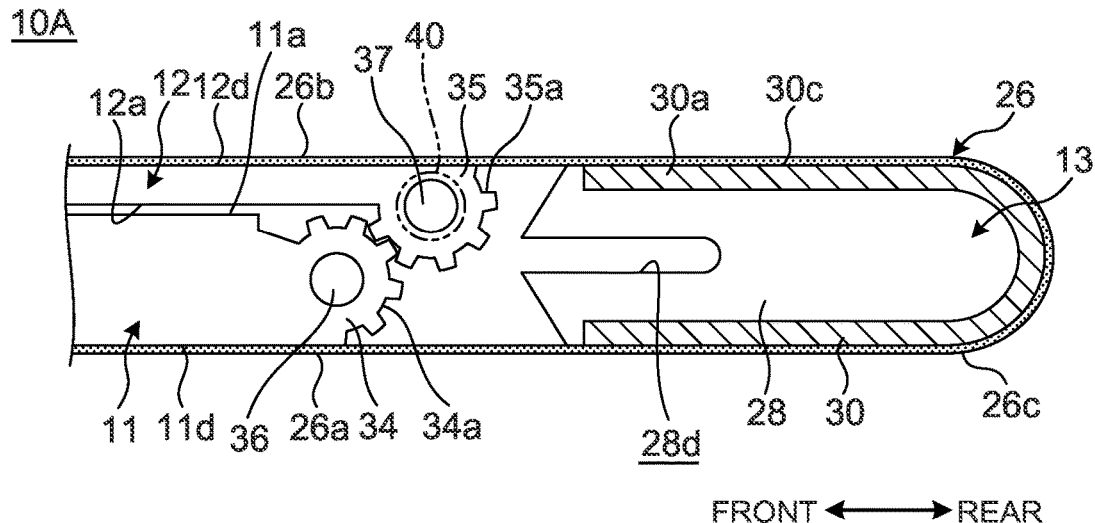
FIG. 10A is a side sectional diagram illustrating, in the enlarged state, one example of the third chassis and the surroundings thereof in a state where an electronic apparatus according to one modified example of the present invention is brought into the zero-degree posture.
Figure 10B:
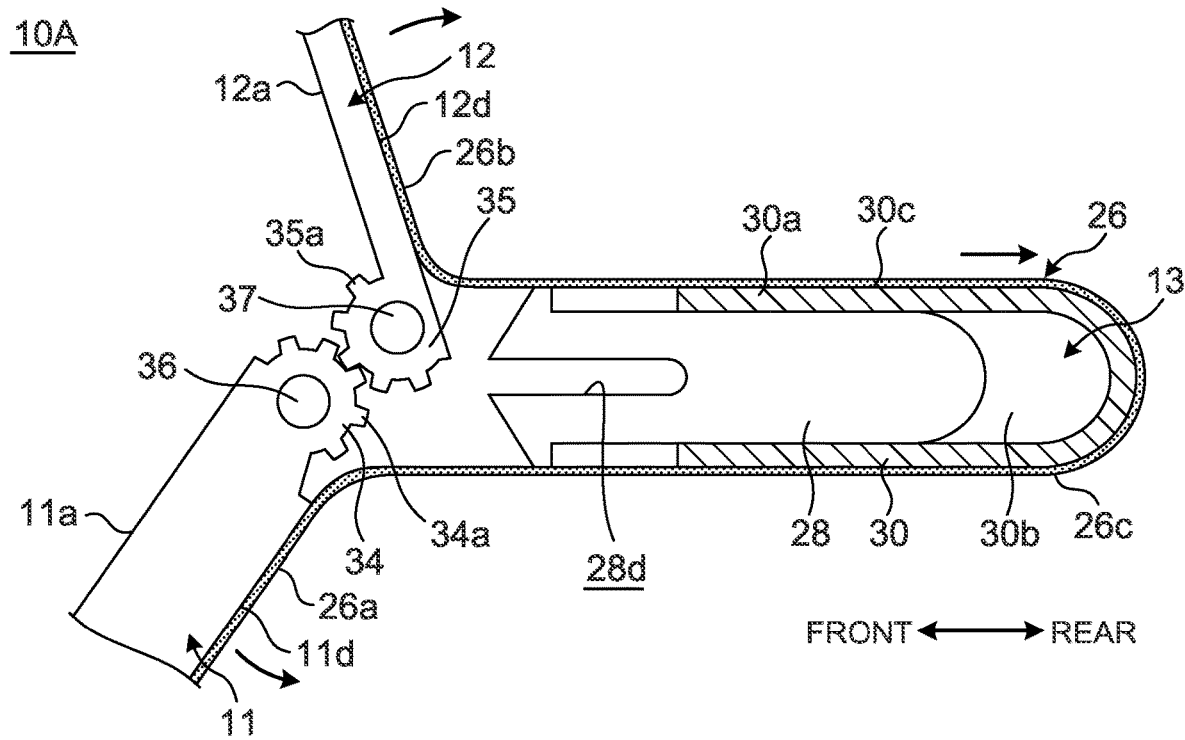
FIG. 10B is a side sectional diagram illustrating one example of a state where the posture of the electronic apparatus illustrated in FIG. 10A is changed to a posture that the electronic apparatus is opened up to about 130 degrees.

FIG. 10A is a side sectional diagram illustrating, in the enlarged state, one example of the third chassis and the surroundings thereof in a state where an electronic apparatus 10A according to one modified example of the present invention is brought into the zero-degree posture. FIG. 10B is a side sectional diagram illustrating one example of a state where the posture of the electronic apparatus 10A illustrated in FIG. 10A is changed to a posture that the electronic apparatus 10A is opened up to about 130 degrees.

The electronic apparatus 10A which is illustrated in FIG. 10A and FIG. 10B has a structure that the thickness of the second chassis 2 is thinned and the respective first and second gear parts 34a and 35a are arranged in an offset state in the front-rear direction in comparison with the above-described electronic apparatus 10. In the electronic apparatus 10A, the first gear part 34a is arranged by being offset more rearward than the second gear part 35a. That is, also, the positions of the respective shafts 36 and 37 are out of alignment with each other in the front-rear direction.

Thereby, in the electronic apparatus 10A, it becomes possible to reduce the vertical total height of the first and second gear parts 34a and 35a in comparison with the electronic apparatus 10 that the respective first and second gear parts 34a and 35a are arrayed vertically in a superposed state. Therefore, in the electronic apparatus 10A, it becomes possible to reduce the thickness of the whole apparatus by thinning the thickness of the second chassis 12.

As indicted by a two-dot chain line in FIG. 10A, in the electronic apparatus 10A, for example, a second gear part 40 which is made smaller than the first gear part 34a in outer diameter may be used. Thereby, in the electronic apparatus 10A, it becomes possible to promote further thinning of the second chassis 12. The second gear part 40 which is made smaller than the first gear part 34a in outer diameter may be also applied to the above-described electronic apparatus 10.

Incidentally, the configuration that the first and second inner covers 18 and 22 are not installed is illustrated in FIG. 10A and FIG. 10B. However, the first and second inner covers 18 and 22 may be installed also in the electronic apparatus 10A. Conversely, the first and second inner covers 18 and 22 may be omitted also in the above-described electronic apparatus 10. In a case where the first and second inner covers 18 and 22 are omitted in the electronic apparatus 10, the respective first and second gear parts 34a and 35a may be directly engaged with each other. In addition, in the electronic apparatus 10, also, the outer cover 26 may be omitted.

Even in a case where the electronic apparatus 10 has a configuration that the first and second inner covers 18 and 22 and the outer cover 26 are omitted in this way, there is no change in the function of housing the electronic component 24 that the third chassis 13 has. That is, the electronic apparatus 10 is capable of attaining improvement of the function of housing the electronic component 24 and the connector section 25 and, in particular, thinning of the first and second chassis 11 and 12 in a case of housing the electronic component 24 and the connector section 24, simultaneously. In particular, in the electronic apparatus 10, the third chassis 13 is arranged so as to project rearward from the rear edges 11b and 12b of the first and second chassis 11 and 12. Accordingly, the third chassis 13 is capable of attaining a high ability of housing the electronic component 24 and so forth when taking the zero-degree posture which is illustrated in FIG. 2 and so forth with no influence on the thickness of the electronic apparatus 10.

Incidentally, it goes without saying that the present invention is not limited to the above-described embodiment and is able to be freely altered and modified within the range not deviating from the gist of the present invention.

Although a mechanism that the rotational moving operations of the first and second chassis 11 and 12 are performed in synchronization with each other is exemplified in the above description, the first and second chassis 11 and 12 may be also configured to rotationally move out of synchronization with each other.

The invention claimed is:
1. An electronic apparatus comprising:
a first chassis;
a second chassis; and
a third chassis which is configured to have a first coupling section rotatably coupled with a rear edge of the first chassis and a second coupling section rotatably coupled with a rear edge of the second chassis and thereby couples together the first chassis and the second chassis to be relatively rotationally movable, wherein the third chassis projects more rearward than the rear edges of the first chassis and the second chassis by having the first coupling section and the second coupling section on a front edge thereof and houses therein an electronic component;

the first chassis and the second chassis are at least relatively rotationally movable from a zero-degree posture such that the first chassis and the second chassis are arranged one upon another where front faces thereof mutually face to an angled posture which exceeds a 90-degree posture when front faces thereof are orthogonal to each other, and in the zero-degree posture, the third chassis projects rearward from the rear edges of the first chassis and the second chassis which are arranged one upon another and an outer face thereof is contiguous with a back face of the first chassis and a back face of the second chassis; and further comprising:

a flexible outer cover member, wherein the outer cover member continuously covers a range from the back face of the first chassis to the back face of the second chassis through the outer face of the third chassis.

2. The electronic apparatus according to claim 1, wherein the third chassis has a chassis coupling section on which the first coupling section and the second coupling section are installed, and a cover fixing section supported by the chassis coupling section so as to be relatively slidable along a direction so that the third chassis projects from the rear edges of the first chassis and the second chassis, and the outer cover member is fixed to an outer face of the cover fixing section.

3. The electronic apparatus according to claim 1, wherein a first gear part is on the rear edge of the first chassis, a second gear part is on the rear edge of the second chassis, and the first gear part and the second gear part rotate in synchronization with each other.

4. The electronic apparatus according to claim 3, wherein the first gear part and the second gear part are arranged out of positional alignment with each other in a direction so that the third chassis projects from the rear edges of the first chassis and the second chassis.

5. The electronic apparatus according to claim 1, wherein the first coupling section and the second coupling section are arranged vertically in a thickness direction of the third chassis and a plurality of sets of the vertically arranged first coupling sections and second coupling sections are installed, the respective sets of the first and second coupling sections are arranged side by side along a width direction of the front edge of the third chassis with a space being interposed between the sets of the first and second coupling sections, the rear edge of the first chassis is coupled with the first coupling section in the space, and the rear edge of the second chassis is coupled with the second coupling section in the space.

6. The electronic apparatus according to claim 1, wherein a thickness of the third chassis is substantially the same as a total value obtained by adding a thickness of the first chassis and a thickness of the second chassis together.

7. The electronic apparatus according to claim 1, wherein the electronic component includes one or a plurality of components including a loudspeaker device, an electronic circuit board, an antenna device and an external connection terminal.

8. The electronic apparatus according to claim 1, wherein each rotational movement angle between the first chassis and the third chassis, and between the second chassis and the third chassis, is half a rotational movement angle between the first chassis and the second chassis in a case where the first chassis and the second chassis are rotationally moved.

9. An electronic apparatus comprising:

a first chassis;

a second chassis; and a third chassis which is configured to have a first coupling section rotatably coupled with a rear edge of the first chassis and a second coupling section rotatably coupled with a rear edge of the second chassis and thereby couples together the first chassis and the second chassis to be relatively rotationally movable, wherein the third chassis projects more rearward than the rear edges of the first chassis and the second chassis by having the first coupling section and the second coupling section on a front edge thereof and houses therein an electronic component;

a first gear part is on the rear edge of the first chassis, a second gear part is on the rear edge of the second chassis, the first gear part and the second gear part rotate in synchronization with each other, a flexible first inner cover member covers a front face of the first chassis; and a flexible second inner cover member covers a front face of the second chassis, wherein the first inner cover member has a first front gear part on a front face of a rear edge thereof and a first back gear part on a back face of the rear edge thereof, the second inner cover member has a second front gear part on a front face of a rear edge thereof and a second back gear part on a back face of the rear edge thereof, the rear edges of the first inner cover member and the second inner cover member are configured to pass between the first gear part and the second gear part, to enter the inside of the third chassis and to be retractable relative to the third chassis when the first gear part and the second gear part are engaged with each other, the first back gear part is engaged with the first gear part, and the second back gear part is engaged with the second gear part.

* * * * *